United States Patent
Mizrahi et al.

(10) Patent No.: US 6,249,365 B1
(45) Date of Patent: Jun. 19, 2001

(54) WDM OPTICAL COMMUNICATION SYSTEMS WITH WAVELENGTH-STABILIZED OPTICAL SELECTORS

(75) Inventors: Victor Mizrahi, Columbia; Stephen R. Harmon, Severn, both of MD (US)

(73) Assignee: CIENA Corporation, Linthicum, MD (US)

( * ) Notice: Subject to any disclaimer, the term of this patent is extended or adjusted under 35 U.S.C. 154(b) by 0 days.

(21) Appl. No.: 09/505,329

(22) Filed: Feb. 16, 2000

Related U.S. Application Data

(62) Division of application No. 08/848,422, filed on May 8, 1997, now Pat. No. 6,111,681, which is a continuation of application No. 08/605,856, filed on Feb. 23, 1996, now Pat. No. 5,673,129.

(51) Int. Cl.[7] .................................................. H04J 14/02
(52) U.S. Cl. ............................................. 359/130; 385/37
(58) Field of Search .................................... 359/130, 187; 385/37

(56) References Cited

U.S. PATENT DOCUMENTS

| | | | |
|---|---|---|---|
| 4,485,475 | * 11/1984 | Large et al. | 372/32 |
| 4,922,480 | 5/1990 | Bosch | 372/3 |
| 4,942,568 | 7/1990 | Khoe et al. | 370/3 |
| 4,989,201 | 1/1991 | Glance | 359/133 |
| 5,042,898 | 8/1991 | Morey et al. | 385/37 |
| 5,077,816 | 12/1991 | Glomb et al. | 385/37 |
| 5,299,212 | 3/1994 | Koch et al. | 372/32 |
| 5,333,089 | 7/1994 | Heidemann | 359/341 |
| 5,387,992 | 2/1995 | Miyazaki et al. | 359/124 |
| 5,457,760 | 10/1995 | Mizrahi | 385/37 |
| 5,475,780 | 12/1995 | Mizrahi | 385/37 |
| 5,485,581 | 1/1996 | Ventrudo et al. | 372/6 |
| 5,579,143 | 11/1996 | Huber | 359/130 |
| 5,589,970 | 12/1996 | Leju et al. | 319/133 |
| 5,673,129 | * 9/1997 | Mizrahi | 359/124 |
| 5,875,273 | * 2/1999 | Mizrahi et al. | 385/37 |
| 5,943,152 | * 8/1999 | Mizrahi et al. | 359/187 |

FOREIGN PATENT DOCUMENTS

| | | |
|---|---|---|
| 0653652 | 5/1995 | (EP) . |
| 0021936 | 1/1991 | (JP) . |

OTHER PUBLICATIONS

Ashish et al., *IEEE Journal of Lightwave Technology*, vol. 14, No. 1, Jan. 1996, pp.58–65.
Woodward et al., *IEEE Photonics Technology Letters*, vol. 5, No. 6, Jun. 1993, pp. 628–630.
Bilodeau et al., *IEEE Photonices Technology Letters*, vol. 6, No. 1, Jan. 1994, pp. 80–82.
Chung et al., *IEEE Photonics Technology Letters*, vol. 6, No. 7, Jul. 1994, pp. 792–795.
Kashyap et al., *IEEE Photonics Technology Letters*, vol. 5, No. 2, Jan. 1994, pp. 80–82.
Erdogan et al., *J. Appl. Phys.*, vol. 76, No. 1, Jul. 1994, pp. 73–80.

* cited by examiner

*Primary Examiner*—Kinfe-Michael Negash
(74) *Attorney, Agent, or Firm*—David L. Soltz; Michael R. Cammarata

(57) ABSTRACT

The present invention provides a wavelength division multiplexed optical communication system with dynamically stabilized wavelength selectors. To accurately correlate the wavelength of a wavelength selector to the wavelength emitted by an optical transmission source, the present invention uses an optical detector and feedback loop to optimize the wavelength of an optical selection element in accordance with a wavelength of an incident optical channel. In one embodiment, the optical selection element is a Bragg grating associated with a grating wavelength controller, such as a temperature regulator or strain tuning system, to adjust the wavelength band of maximum reflectivity of the grating. The feedback loop communicates with the optical detector and the wavelength controller to modify the grating's reflection wavelength band in accordance with the wavelength of an incident optical channel.

4 Claims, 7 Drawing Sheets

WDM OPTICAL COMMUNICATION SYSTEMS WITH WAVELENGTH-STABILIZED OPTICAL SELECTORS

This is a divisional of U.S. patent application Ser. No. 08/848,422, filed May 8, 1997 and now U.S. Pat. No. 6,111,681, which is a continuation of U.S. patent application Ser. No. 08/605,856, filed Feb. 23, 1996 and now U.S. Pat. No. 5,673,129.

FIELD OF THE INVENTION

The invention relates to wavelength division multiplexed optical communication systems and, more particularly, to wavelength division multiplexed optical communication systems which include stabilized optical selectors whose optical channel-selecting wavelength band is optimized in accordance with an incident optical channel.

BACKGROUND OF THE INVENTION

Optical communication systems are a substantial and fast-growing constituent of communication networks. The expression "optical communication system," as used herein, relates to any system which uses optical signals to convey information across an optical waveguiding medium. Such optical systems include, but are not limited to, telecommunications systems, cable television systems, and local area networks (LANs). Optical systems are described in Gowar, Ed. *Optical Communication Systems*, (Prentice Hall, N.Y.) c. 1993, the disclosure of which is incorporated herein by reference. Currently, the majority of optical communication systems are configured to carry an optical channel of a single wavelength over one or more optical waveguides. To convey information from plural sources, time-division multiplexing is frequently employed (TDM). In time-division multiplexing, a particular time slot is assigned to each information source, the complete signal being constructed from the signal portions created for each time slot. While this is a useful technique for carrying plural information sources on a single channel, its capacity is limited by fiber dispersion and fiber nonlinearities.

While the need for communication services increases, the current capacity of existing waveguiding media is limited. Although capacity may be expanded, e.g., by laying more fiber optic cables, the cost of such expansion is prohibitive. Consequently, there exists a need for a cost-effective way to increase the capacity of existing optical waveguides.

Wavelength division multiplexing (WDM) has been explored as an approach for increasing the capacity of fiber optic networks. A WDM system employs plural optical signal channels, each channel being assigned a particular channel wavelength. Since each channel can itself carry plural information sources via time division multiplexing, additional optical channels increase capacity over a single channel system in proportion to the number of channels. For example, a four-channel WDM optical system has 400% greater capacity than a conventional single channel system. In a WDM system, signal channels are generated, multiplexed, and transmitted over a waveguide. At the receiving end, the WDM optical signal is demultiplexed such that each channel wavelength is individually routed to a designated receiver. Through the use of optical amplifiers, such as doped fiber amplifiers, plural optical channels are directly amplified simultaneously, facilitating the use of WDM systems in long-distance optical systems.

In order for a signal to be demultiplexed, a single optical channel must be selected from the multiplexed optical signal. Bragg gratings designed to reflect precise, narrow-bandwidth optical signals may be employed as the wavelength-selecting elements. To ensure that an optical signal is properly selected, the carrier wavelength launched by the laser transmitter must accurately match the reflection wavelength selected by the corresponding grating. This is particularly true in WDM systems employing many channels, often referred to as "dense" WDM, where channel spacings are on the order of a nanometer. Such WDM systems require precise correspondence of the optical signal wavelength to the wavelength selection element wavelength for each channel in order to avoid "crosstalk," i.e., interference between adjacent channels.

Previously, attempts have been made to stabilize laser transmitters against long-term drift in order to produce an optical signal source having a constant wavelength. The issue of aging-induced wavelength shifts in source lasers is discussed in Chung et al., *Phot. Tech. Lett.* Vol. 6, No. 7, July, 1994, pp. 792–795, the disclosure of which is incorporated by reference herein. In U.S. Pat. No. 5,077,816 to Glomb et al., a portion of the output of a narrowband laser source is transmitted through a weak fiber Bragg grating. The amount of the laser signal passing through the grating is detected, and the amount of electrical energy supplied to the laser is varied in proportion to the amount of light passing through the grating. In this manner, the deviation between the wavelength of the light and the wavelength of the grating is minimized. In U.S. Pat. No. 5,299,212 to Koch et al., the wavelength of a tunable laser source is controlled using a fiber grating as a wavelength reference. In this patent, a feedback control current is fed to the Bragg section of a multi-segment DBR laser such that the wavelength of the laser is a function of the feedback control current.

While these techniques may be useful for controlling the wavelength of the optical signal source, the patents are silent concerning the wavelength control of the wavelength selectors within the WDM optical system. Further, the patents do not stabilize the wavelengths of the gratings which are used as wavelength references for the source lasers. Since the wavelength band of maximum reflectance for Bragg gratings can change over time, failure to stabilize the grating wavelength can cause the optical source locked to the grating to undesirably drift with the grating, risking interference with adjacent channels. For example, in FIG. 5 of the Glomb patent, a first set of Bragg gratings is used as frequency selective taps while a second set of Bragg gratings is used to determine the frequencies of the laser transmitters. Such a technique is an "open-loop" strategy for wavelength control in WDM optical communication systems. In an open-loop system, individual devices may be calibrated to wavelength references or standards, but the devices are not dynamically standardized against each other, leaving open the possibility that the wavelengths emitted or selected by the various devices are not correlated to each other over the lifetime of the system.

Due to the potential discrepancy between a launched laser wavelength and a grating selector wavelength, the grating wavelength band of maximum reflectivity is designed to be much wider (more than an order of magnitude) than the modulated laser wavelength band. This greater width assures the "capture" of the appropriate laser signal wavelength. However, the width of a Bragg grating is not uniform throughout its reflection spectrum. As seen in FIG. 1, which plots log reflectance vs. wavelength for a typical grating, the width of the Bragg grating near the peak reflectance is significantly narrower than the width of the Bragg grating at low reflectance. Although the operational region of the grating is designed to be at the maximum reflectance, the approximately trapezoidal shape of the reflectance spectrum adversely impacts the interchannel spacing for a wavelength division multiplexed optical system. For example, aggregate reflection of all adjacent channels of as little as −20 dB relative to the selected channel can adversely affect the system performance. Consequently, the interchannel spacings must take into account the spectral width of the gratings at low reflectances, not just the maximum reflectance at which the gratings are designed to be used. Failure to adequately space the channels could result in channel crosstalk caused by overlapping adjacent gratings.

Although Bragg gratings can be fabricated to precisely and accurately reflect specific wavelengths, the reflection wavelengths can change with time. See, for example, Erdogan et al. *J. Appl. Phys.* Vol. 76 No. 1, July, 1994, pp. 73–80, the disclosure of which is incorporated by reference. To mitigate wavelength drift over time, accelerated aging of the gratings, described in Erdogan et al., may be employed. However, for dense WDM applications accelerated aging is a time-consuming process, particularly since the gratings must be carefully re-measured following aging. This additional step adds significant expense, and decreases manufacturing yield, of optical devices which incorporate Bragg gratings.

While gratings can be fabricated for reflection of precise channel wavelengths, such accuracy can result in a low grating manufacture yield rate. Because a wavelength division multiplexed optical communication system can use hundreds of Bragg gratings in variols optical devices, it would be useful to employ a set of highly precise "master gratings" to which other, possibly less precise gratings, are correlated.

There is a need in the art for improved wavelength division multiplexed optical communication systems, particularly, systems which accurately correlate the wavelength selected by one or more optical selectors to a wavelength emitted by an optical transmission source. More specifically, when Bragg gratings are used as the optical selection elements, there is a need to ensure that the reflection wavelength band of the grating corresponds to the optical channel wavelength transmitted within the optical system. By dynamically matching the grating wavelength to the laser wavelength for the life of the communication system, the spectral width of the gratings can be sufficiently narrowed to permit small interchannel spacings, resulting in greater channel density within a given spectral region. Such stabilized Bragg gratings could be used to provide highly accurate optical wavelength selectors, add/drop multiplexers, and demultiplexers for WDM applications. Further, such techniques would create a closed-loop optical system, i.e., an optical system in which information about the incident optical channel is used to control the channel selector grating wavelength, or in which the optical channel is locked to the selector grating reflection wavelength, assuring accurate correspondence between optical channels and wavelength selectors.

SUMMARY OF THE INVENTION

To accurately correlate the wavelength of a wavelength selector to the wavelength emitted by an optical transmission source, the present invention uses an optical detector and feedback loop to optimize the wavelength of an optical selection element in accordance with a wavelength of an incident optical channel. In one embodiment, the optical selection element is a Bragg grating associated with a grating wavelength controller to adjust the wavelength band of maximum reflectivity of the grating. A feedback loop communicates with the wavelength controller to modify the grating's reflection wavelength band in accordance with the wavelength of an incident optical channel.

More particularly, the present invention provides a wavelength division multiplexed optical communication system comprising a plurality of optical transmitters for outputting a plurality of optical signals, each optical signal having a particular optical channel wavelength. An optical combiner optically communicates with each of the optical transmitters to combine the optical signals, creating a wavelength division multiplexed optical communication signal. This wavelength division multiplexed optical communication signal exits the combiner through an output path to an optical transmission line.

At least one optical wavelength selector optically communicates with the optical transmission line such that the wavelength selector receives at least a portion of the wavelength division multiplexed optical communication signal. The wavelength selector includes a Bragg grating member having a wavelength band of high reflectivity, the wavelength band of high reflectivity for each Bragg grating member corresponding to an optical channel output by one of the optical transmitters. A Bragg grating wavelength control system communicates with the Bragg grating to selectively control the wavelength band of high reflectivity of the Bragg grating. In one embodiment, the wavelength control system is a thermal regulator such as a thermoelectric cooler or resistive heater that varies the grating temperature to alter the grating wavelength. In a further embodiment, the wavelength control system uses strain tuning to adjust the wavelength of the Bragg grating.

An optical detector is positioned to collect optical signals which are transmitted through the Bragg grating or, alternatively, reflected by the Bragg grating, and to convert the optical signals to electrical signals. A feedback control system communicates with the optical detector and the grating wavelength control system to receive the electrical signals from the optical detector. A control signal responsive to the electrical signals received from the optical detector is sent to the Bragg grating wavelength control system. The control signal modifies the grating wavelength band of high reflectivity in accordance with the wavelength of an incident optical channel. In a preferred embodiment, the wavelength control system locks the grating high reflectivity wavelength band to the wavelength of the optical channel to be selected by the grating.

Advantageously, the closed-loop optical communication systems enabled by the present invention make possible the creation of reliable "ultra-dense WDM," i.e., systems in which the interchannel spacing is under 1 nm. Such ultra-dense WDM systems would feature greater than 20 optical channels within the gain spectrum of current erbium-doped fiber amplifiers.

DETAILED DESCRIPTION

Figure 1:
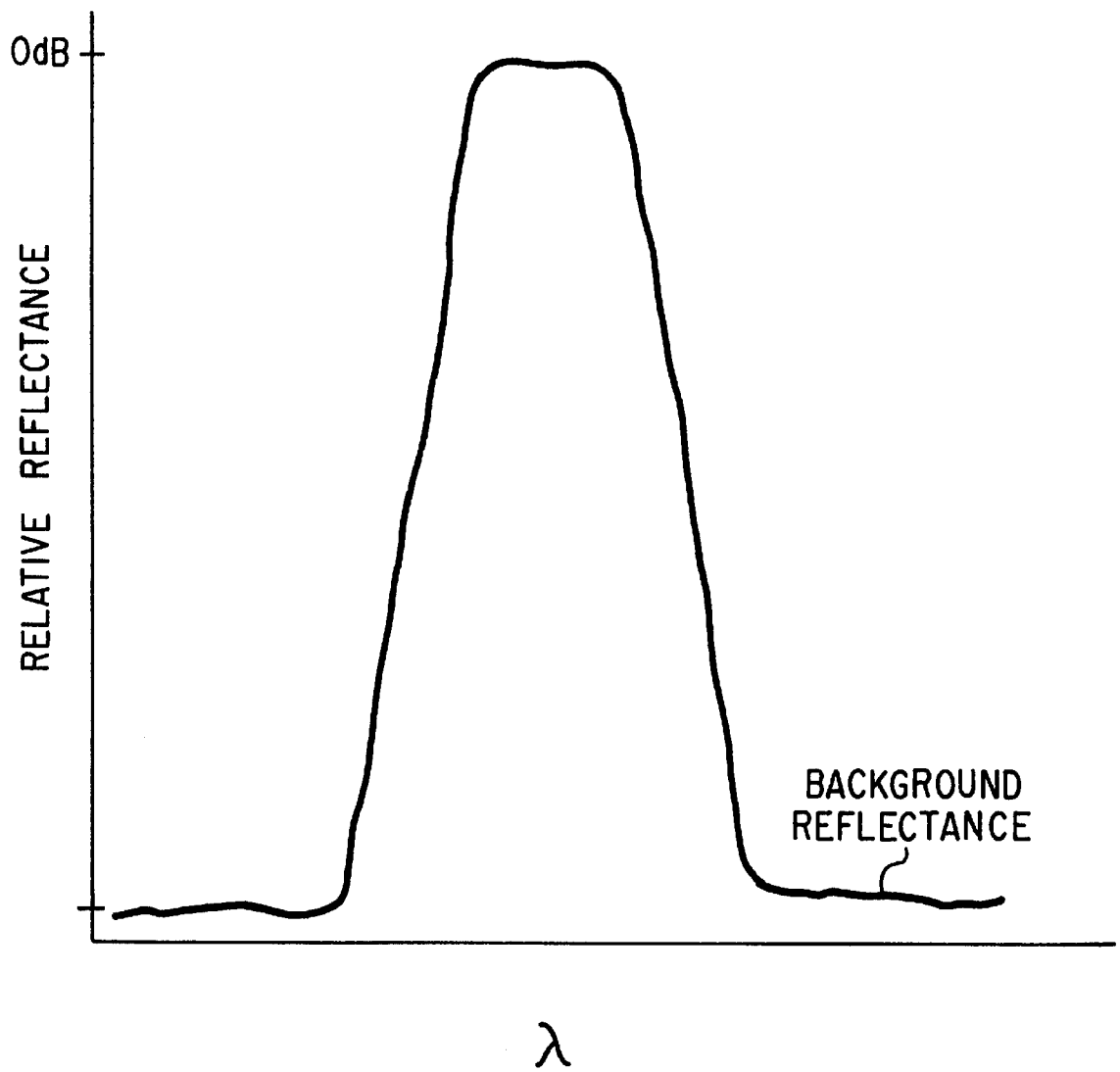
FIG. 1 schematically depicts a log reflectance vs. wavelength spectrum for a Bragg grating.
Figure 2A:
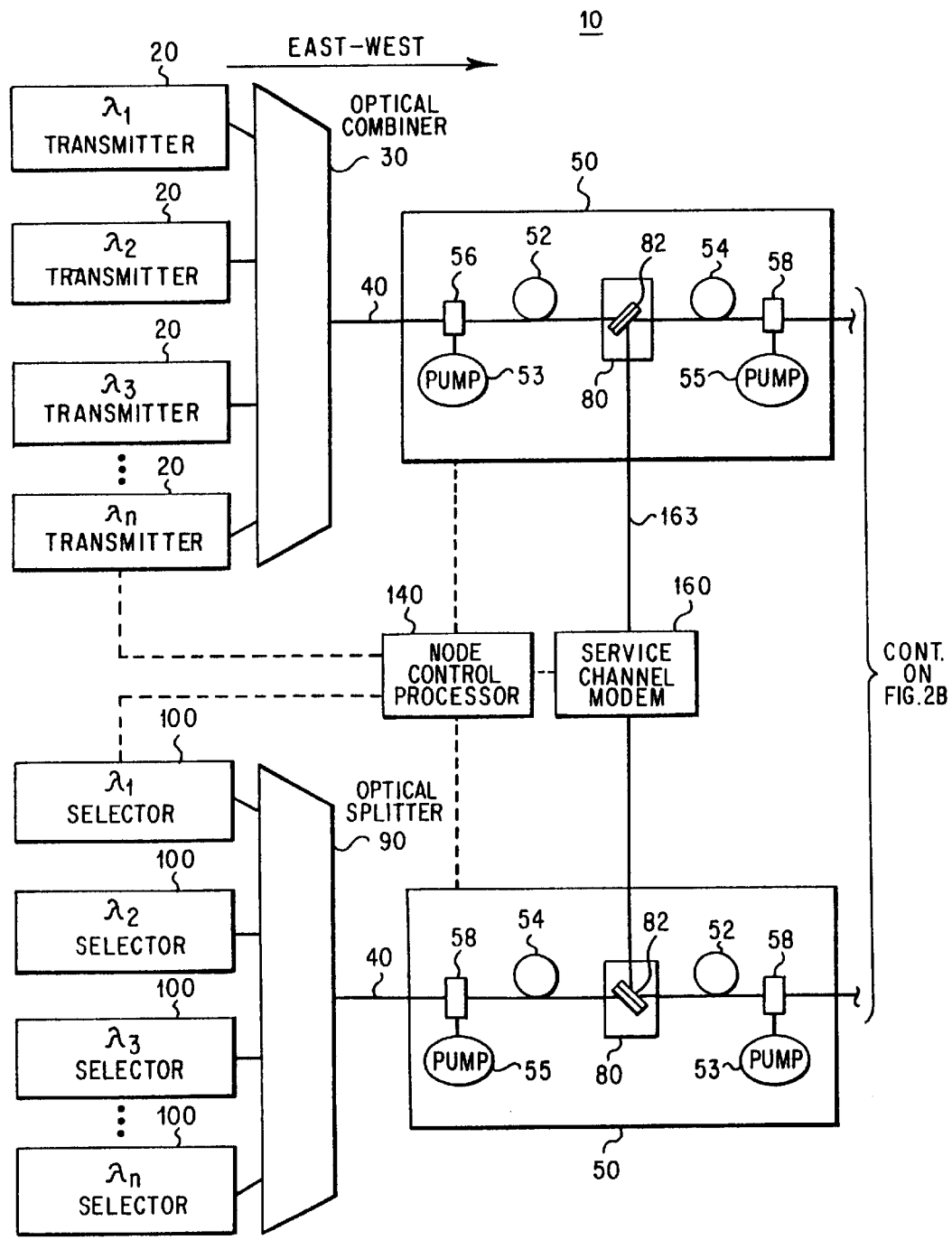
FIG. 2 schematically depicts a wavelength division multiplexed optical communication system according to the present invention.
Figure 2B:
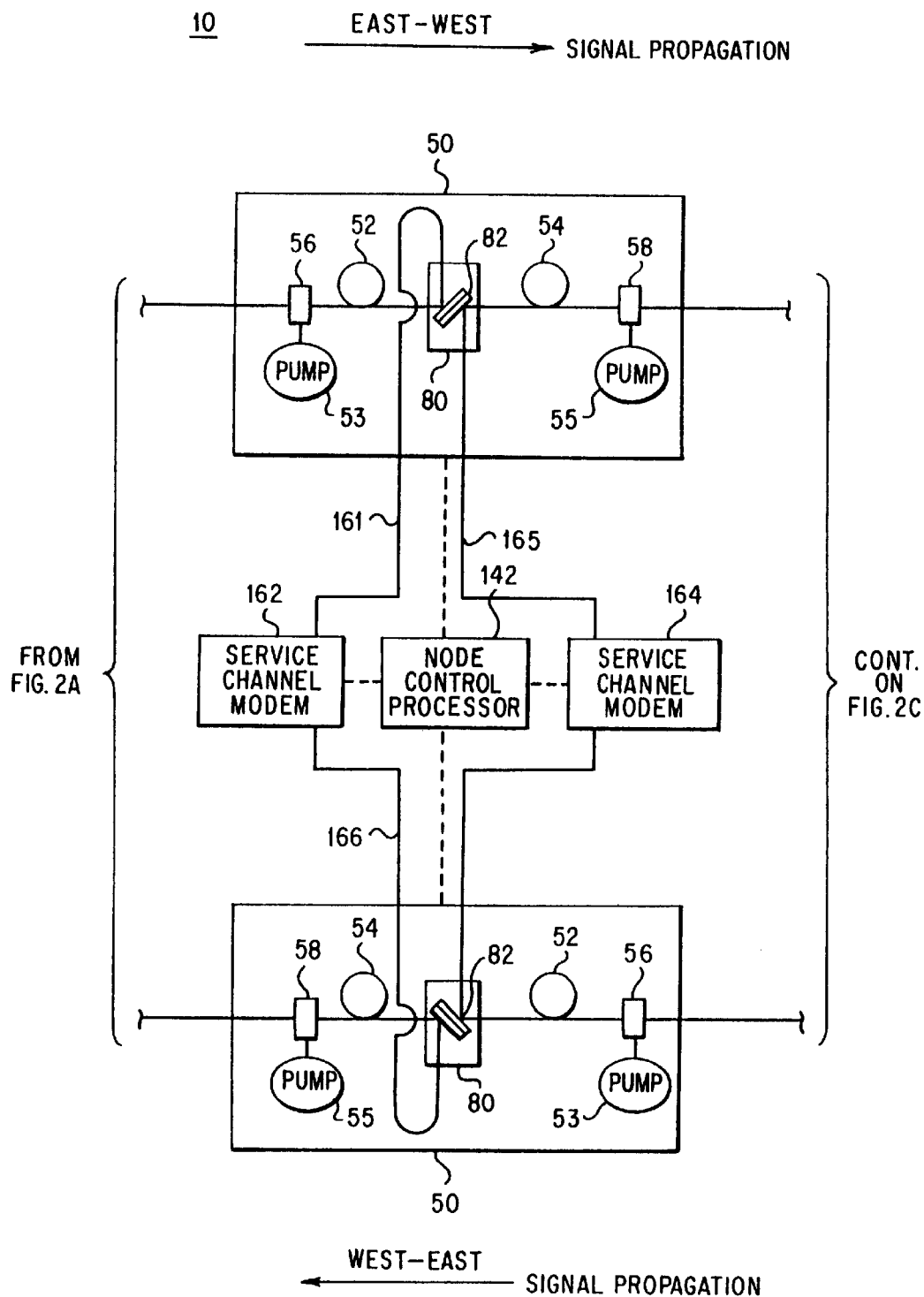
Figure 2C:
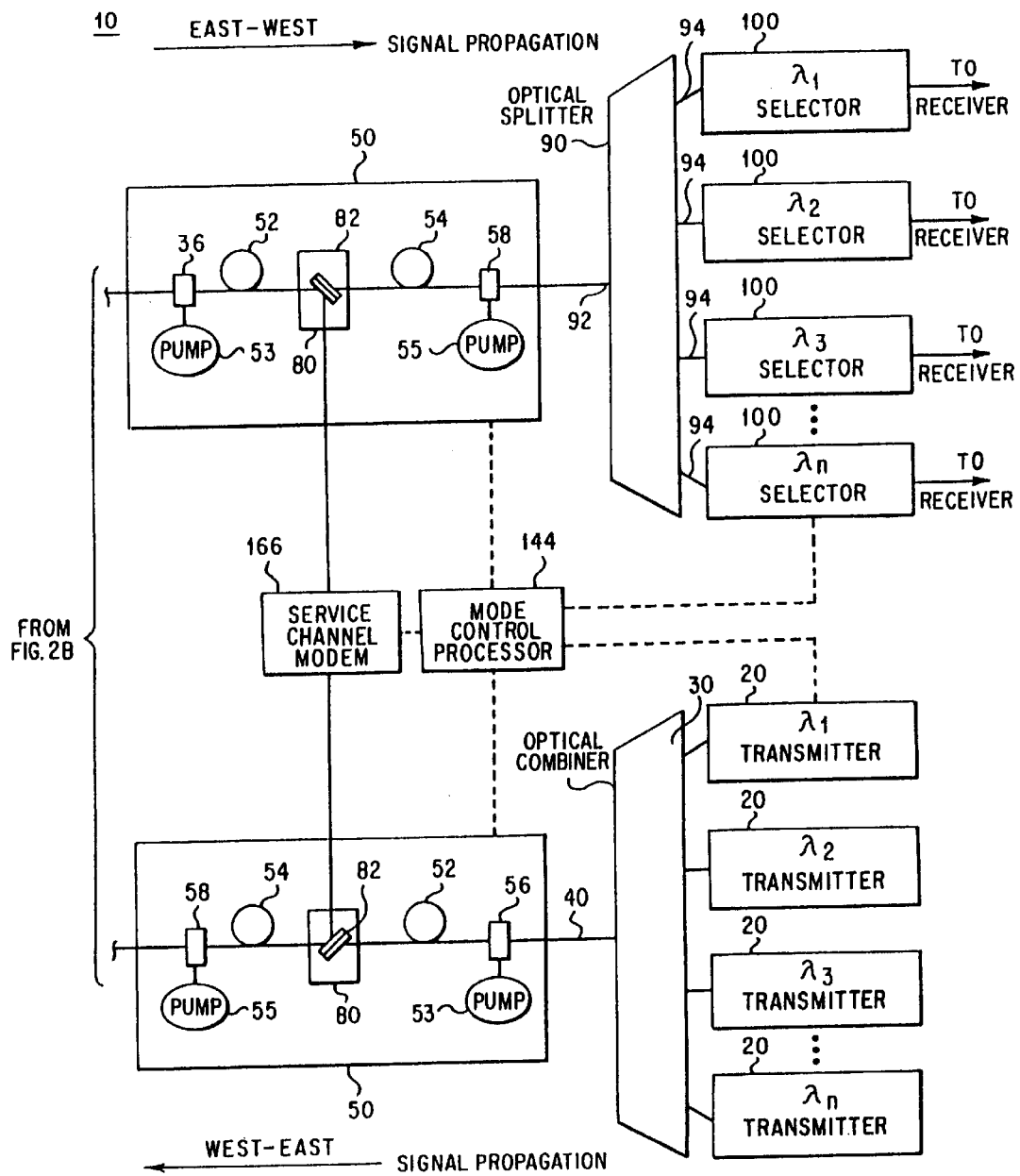

Turning now to the drawings in detail in which like numerals indicate the same or similar elements in each of the views, FIG. 2 depicts a wavelength division multiplexed optical communication system 10 according to one embodiment of the present invention. As depicted in FIG. 2, the top group of components is a nominally east-vest unidirectional system, while the bottom group of components is a nominally west-east unidirectional system. Wavelength division multiplexed optical communication system 10 includes a plurality of optical transmitters 20, each optical transmitter emitting an information-bearing optical signal at a transmission wavelength. The expression "information-bearing optical signal," as used herein, refers to an optical signal which has been coded with information, including, but not limited to, audio signals, video signals, and computer data.

Figure 3:
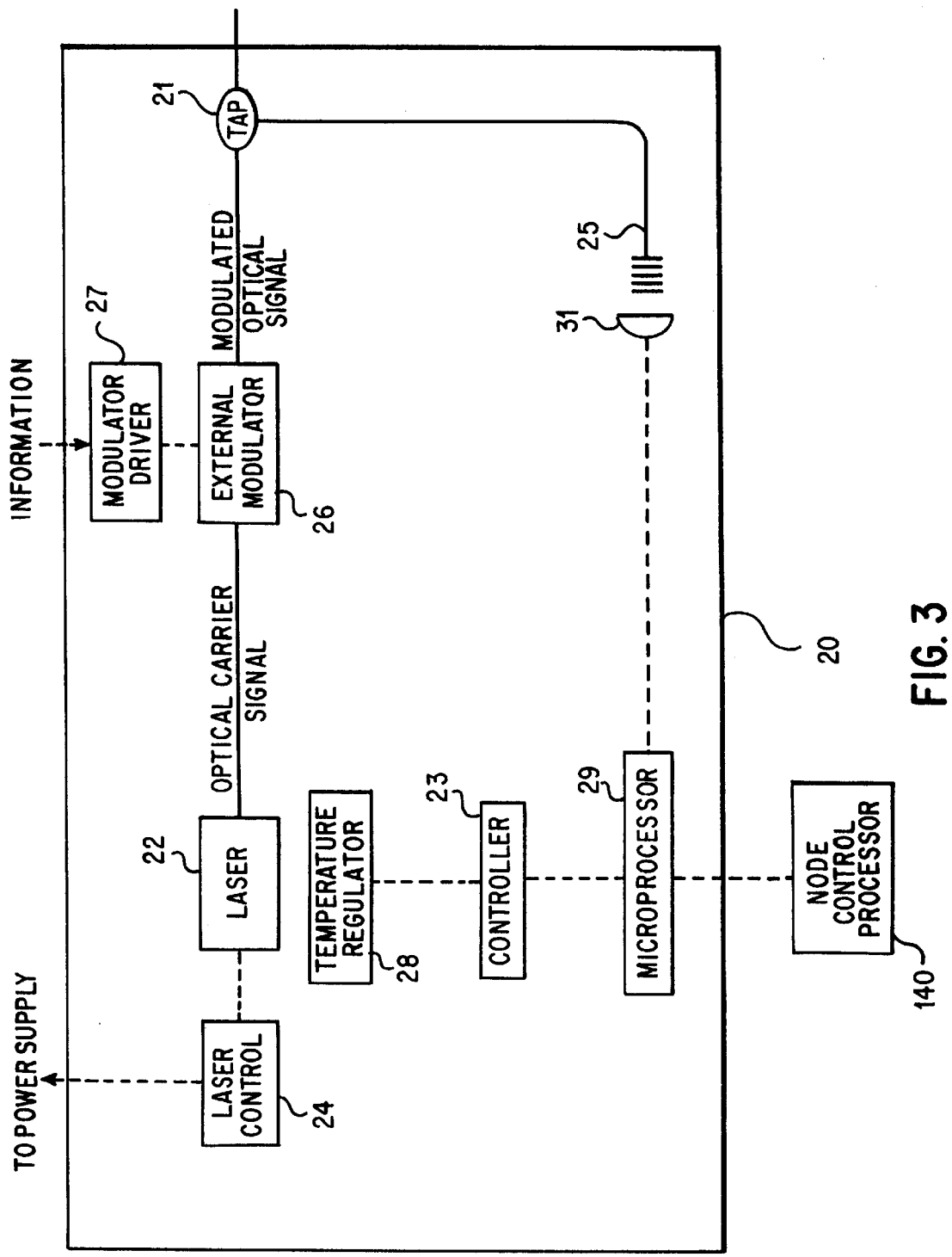
FIG. 3 schematically depicts a laser transmitter for use with the wavelength division multiplexed optical communication system of FIG. 1.

As seen in FIG. 3, each optical transmitter 20 generally includes a laser 22, such as a DFB semiconductor laser, a laser controller 24, and an external modulator 26 for creating an information-bearing optical signal. The solid path lines in FIG. 3 represent optical pathways while the dashed lines represent electrical pathways. In an exemplary embodiment, the transmitter laser is a DFB semiconductor diode laser, generally comprising one or more III–V semiconductor materials, commercially available from a wide variety of suppliers such as Fujitsu, GEC Marconi, Spectra-Diode Laboratories, Inc., Alcatel Optronics, and Hewlett-Packard. The laser outputs an optical carrier signal at a particular channel wavelength corresponding to a wavelength selector channel included in an add/drop multiplexer, optical receiving system, or the like. The laser controller 24 provides the required laser bias current through a suitable power supply (not shown).

The optical transmitter further includes modulator 26 for imparting information to the optical carrier signal. Modulator 26 receives information to be imparted to the optical carrier signal through modulator driver 27. An exemplary modulator is an external modulator, such as a Mach-Zehnder modulator, employing a waveguiding medium whose refractive index changes according to the applied electrical field, i.e., a material exhibiting an electro-optic effect. A suitable electro-optic waveguiding material for the external modulators of the present invention is lithium niobate, $LiNbO_3$. In the Mach-Zehnder configuration, two optical interferometer paths are provided. An incoming optical carrier is split between the two optical paths. At least one path of the interferometer is phase modulated. When the signal is recombined at the output, the light from the paths either constructively or destructively interferes, depending upon the electrical field applied to the surrounding electrodes during the travel time of the carrier, creating an amplitu-demodulated output optical signal. Further details of electro-optic modulators are described in Becker, "Broad-Band Guided Wave Electrooptic Modulators," *IEEE Journal of Quantum Electronics*, Vol. QE-20, No. 7, July, 1984, pp. 723–727, the disclosure of which is incorporated by reference herein. Mach-Zehnder interferometers suitable for use in modulator 26 are commercially available from United Technologies, and IOC.

Optionally, the optical transmitter can include means for reduction of non-linear effects, such as stimulated Brilluoin scattering (SBS), in the optical communication system. Suitable devices and techniques for reduction of non-linear effects which can be employed in the optical communication system of the present invention are described in U.S. Pat. Nos. 5,166,821, 5,200,964, 5,257,124, and 5,295,209, the disclosures of which are incorporated by reference herein.

Alternatively, the external modulator employed in the optical transmitters of the present invention can be selected from electro-absorption external modulators. Electro-absorption modulators function by changing the bandgap of the modulating material to impart information to the optical carrier signal. Exemplary electro-absorption modulators are described in Wood, "Multiple Quantum Well (MQW) Waveguide Modulators," *Journal of Lightwave Technology*, Vol. 6, No. 6, June, 1988, pp. 743–757, the disclosure of which is incorporated by reference herein. Typically, an electroabsorption modulator is positioned on the laser chip itself; consequently, elements 22 and 26 in FIG. 3 become a single integral device in the electro-absorption modulator embodiment.

In a further embodiment of the present invention, information can be imparted to the optical carrier through direct modulation of the laser. In this technique, the laser power supply is varied to directly create an amplitude-modulated optical signal. Direct modulation is discussed in Gowar, *Optical Communication Systems*, incorporated by reference above.

Typically, the wavelengths emitted by optical transmitters 20 are selected to be within the 1500 nanometer range, the range in which the minimum signal attenuation occurs for silica-based fibers. More particularly, the wavelengths emitted by the optical transmitters are selected to be in the range from about 1540 to about 1560 nanometers. However, the optical transmitter wavelengths can be selected to correspond to the gain characteristics of the selected optical amplifiers. Consequently, when using amplifiers with a gain spectrum in a different region, or when using conventional electrical regenerators to amplify a signal the wavelengths of the optical transmitters are selected to be within that gain spectrum, e.g., about 1310 nm in conventional systems.

To ensure the correct optical carrier wavelength is emitted by laser 22, the optical transmitter includes a wavelength reference against which to measure laser output. The wavelength reference is coupled to a feedback loop which uses thermal techniques to control the laser output. Using thermal control, the precise output wavelength of the laser is maintained, typically to within a better than one angstrom bandwidth. An optical tap 21 diverts a small portion of the modulated optical signal, on the order of 5% or less of the optical signal, to the wavelength reference for measuring the laser output. As used herein, the expression "feedback" refers to any technique by which information from one component or device in the optical system is used to assist in the control or guidance of another component or device in the optical system.

In an exemplary embodiment, wavelength reference 25 is selected to be an in-fiber Bragg grating, although other wavelength references, such as Fabry-Perot resonators, volume gratings, and gas-filled lamps can also be employed as wavelength references in the optical transmitters of the present invention. When a Bragg grating is used as the wavelength reference, the grating is typically selected to be a weak grating, with a maximum reflectance on the order of 50%. An optical detector, depicted as element 31 in FIG. 3, measures the optical signal which is transmitted through the grating, converting the optical signal to an electrical signal. The transmitted signal information is submitted to microprocessor 29. Microprocessor 29 uses an algorithm, such as a digital step-track algorithm, to direct controller 23 to drive temperature regulator 28 in the direction which minimizes the transmission through grating 25, thus maintaining the laser output wavelength at the reflection maxima (transmission minima) of the grating.

Temperature regulator 28 thermally controls the laser operating temperature, thereby controlling the laser output wavelength, in response to measurements against the wavelength standard. Typically, temperature regulator 28 comprises a thermoelectric cooler. Temperature regulator 28 receives control signals through controller 23 from microprocessor 29. Microprocessor 29 directs the temperature controller to shift the laser wavelength in the direction which minimizes transmission through the grating for the configuration shown (as described above), thereby locking the laser to the wavelength reference.

A variety of algorithms can be used in the feedback loops of the present invention. In the selected digital step-track algorithm, the laser wavelength is maintained within the transmission minima "well" of the reference grating. To initialize the system, the transmission minima of the grating is determined as microprocessor 29 "walks" the laser wavelength across a spectral region (through shifting the laser temperature via temperature regulator 28) and finds the voltage minima as measured by photodetector 31. This voltage minima becomes the initial "set point" used in the step-track algorithm. A preset threshold voltage (i.e., the absolute value of the difference between a measured voltage and the set point voltage minima) determines whether the status quo will be maintained or whether temperature control electronics will be "stepped" to return the laser wavelength to the transmission minima. As long as the light incident on the photodetector produces a voltage within the threshold value, as referenced to the set point voltage, the status quo is maintained by the temperature control electronics.

If the measured voltage difference exceeds this threshold value, the temperature control electronics are "stepped" in one direction, and the results are measured. If the step produces a measurement further away from the threshold value, then the temperature control electronics are "stepped" in the other direction and the results measured. This process continues until the transmission minima of the grating is reached by the laser wavelength. To determine if the minima of the grating has been reached, the temperature control electronics are stepped until the wavelength starts moving up the opposite side of the grating. Since the subsequent measurement will be worse than the previous one taken at the precise minima, the temperature control electronics will be stepped back to that point. When stabilization is thus reached, the transmission minima defines a new set point from which the threshold will be measured. Accordingly, the stepping process ceases until the dynamic measurement process again detects that the threshold has been exceeded.

Advantageously, the microprocessor can be programmed to ignore extremely large changes between adjacent data points, i.e., spurious readings, particularly if a subsequent data point is consistent with the earlier-measured readings. Additionally, the microprocessor communicates with the laser controller (not shown) to verify that the laser is operating properly. These techniques ensure that the laser wavelength is not altered in response to spurious readings, eliminating the risk that the laser will be driven into the wavelength band of adjacent channels. Microprocessor 29 additionally communicates with node control processor 140 (described in detail below). Because node control processor 140 receives information from each of the optical transmitters, this communication can provide additional information about adjacent channels to assure that laser wavelengths do not interfere.

Note that the while the above wavelength reference configuration is exemplary, many other wavelength reference configurations can be used in the optical transmitters of the present invention. For example, a photodetector can be positioned to capture the signals reflected by a Bragg grating wavelength reference, as opposed to the transmitted signals as shown in the FIG. 3 configuration. In a further embodiment, the wavelength reference is positioned substantially downstream of the laser transmitter, including being positioned beyond the optical combiner following the creation of a WDM optical signal, to be described below in conjunction with FIG. 5. When remote positioning of the wavelength reference is used, adjacent channel optical signals can be identified and removed electronically through tone identification of individual optical channels, as described below. Any wavelength reference and feedback technique for stabilizing a laser output wavelength can be employed in the WDM optical systems of the present invention.

When optical transmitters 20 form part of an existing optical system, a plurality of remodulators (not shown) can be optionally included. Such remodulators operate to map a space division optical communication system, i.e., a system in which individual optical signals are physically separated in space by transmission on separate waveguides, onto a wavelength division optical communication system, i.e., a communication system in which individual optical signals are simultaneously transmitted in the same waveguide by receiving an information-bearing optical signal at an input and outputting an optical channel having a carrier wavelength corresponding to a demultiplexer wavelength in a WDM optical system. The use of optical remodulators ensures compatibility of optical communication system 10 with currently-deployed transmission equipment. Further description of wavelength division multiplexed optical communication systems with remodulators, along with other details of laser transmission in WDM optical systems are found in commonlyassigned U.S. Pat. No. 5,504,609, issued Apr. 6, 1996, (Attorney Docket No. 100 mab), the disclosure of which is incorporated by reference herein. Further description of optical transmitters which may be employed in the optical communication systems of the present invention is found in Gowar, *Optical Communication Systems*, incorporated by reference above.

Each information-bearing optical signal produced by an optical transmitter (or an optical remodulator, if present) constitutes a channel in optical system 10, the wavelength of which corresponds to a selector wavelength in a receiving system. The optical signal channels output from transmitters 20 are brought together in optical combiner 30 for conveyance to optical waveguide 40. Optical combiner 30 is selected from any passive optical component which can combine plural wavelengths into a single output medium. Frequently, optical splitters used to divide a signal among plural outputs are used as optical combiners, operated in reverse fashion from the splitter. Exemplary optical combiners include 1×N wideband single mode splitters available from IOT Integrierte Optik GmbH, Waghausel-Kirrlach, Germany and fused fiber combiners available from Gould, Inc., Millersville, Md. The combination of channels forms a multiplexed optical signal which is output to waveguide 40. Optical waveguide 40 is typically a single-mode optical fiber such as SMF-28, available from Coming, and TRUEWAVE, available from AT&T Corp., and is the principal transmission medium for the optical communication system. However, any optical waveguide which is capable of transporting multiple optical wavelengths can be employed as waveguide 40 in optical system 10.

Interposed along optical waveguide 10 are a plurality of optical amplifiers 50. Optical amplifiers 50 directly increase the strength of the multiplexed optical signal without the need for optical-to-electrical conversion. Optical amplifiers, their materials, and their operation are further described in Gowar, Ed. *Optical Communication Systems*, incorporated by reference above, Bjarklev, *Optical Fiber Amplifiers: Design and System Applications*, (Artech House, Norwood, Mass.), c. 1993, the disclosure of which is incorporated herein by reference, and in Desurvire, *Erbium-Doped Fiber Amplifiers*, (John Wiley & Sons, Inc., NY), c. 1994, the disclosure of which is incorporated herein by reference. Exemplary optical amplifiers providing substantially uniform gain across a broad spectral region are described in copending U.S. patent application Ser. No. 08/554,976, (Attorney's Docket No.: 106mab), the disclosure of which is incorporated herein by reference.

Amplifiers 50 include first and second doped fiber amplifier stages 52 and 54, and pump connecting elements 56 and 58. In general, amplifier stages 52 and 54 are selected from optical waveguides doped with a material which can produce laser action in the waveguide. Such materials include rare earth dopants such as erbium, neodymium, praseodymium, ytterbium, or mixtures thereof. Pumping of the doped waveguide at a specific pump wavelength causes population inversion among the electron energy levels of the dopant, producing optical amplification of the wavelength division multiplexed optical signals. For doped fiber amplifiers employing erbium as the dopant, a wavelength band between approximately 1520 nm and approximately 1580 nm provides gain to optical signals when the doped fiber is pumped. To provide ASE noise suppression, an isolator (not shown) is optionally positioned between the first and second amplifier stages.

To provide pump energy to the amplifier stages, connecting elements 56 and 58 are provided. These are typically wavelength selective multiplexers which permit pump radiation to enter the doped fiber sections without allowing transmission channel radiation to pass into the pump. Optical pumping elements 53 and 55 are generally selected from 980 and 1480 nm laser sources. In one embodiment, a 980 nm pump can be used as pump 53 to pump the first stage of the amplifier while a 1480 nm pump is used as pump 55 to pump the second stage of the amplifier. A single laser source, comprising single or multiple laser diodes, can be used to pump both fiber sections or to pump two amplifier stages located in separate optical amplifiers. Alternatively, separate laser sources, having the same or different pumping wavelengths, can be used to pump each fiber section. Further description of amplifier pumping schemes suitable for use in the wavelength division multiplexed optical communication system of the present invention is found in *Optical Fiber Amplifiers*, incorporated by reference above. Although the above-described pumping arrangements are exemplary, any pumping configuration which supplies sufficient power to the optical amplifier stages to create the desired gain can be used in the optical communication systems of the present invention.

The amplifier stages are interconnected through interconnection element 80, selected to be a four-port wavelength division multiplexer. Multiplexer 80 includes at least one wavelength selective member 82 for selecting one or more optical monitoring/service channels to enter and exit the communication system. Wavelength selective member 82 can be a multilayer thin film interference filter constructed to reflect an optical monitoring/service channel. In an exemplary embodiment, member 82 reflects optical signals having a wavelength of 1625 nm. The payload optical channels, i.e., those WDM signal channels having wavelengths within the gain band of the optical amplifier, pass through wavelength selective member 82 unaffected. Suitable wavelength division multiplexers for use in the optical communication systems of the present invention are commercially available from JDS-Fitel, Inc. Other techniques for interconnecting the first and second amplifier stages and for inserting and removing service channels from optical amplifiers are described in commonly-assigned allowed U.S. patent application Ser. No. 08/457,292, the disclosure of which is incorporated by reference herein.

Although not depicted in FIG. 2, the amplifier modules include a microprocessor for monitor and control of various amplifier functions such as optical signal gain (in conjunction with optional optical taps positioned before the first stage of the amplifier and after the second stage of the amplifier), pump powers, pump wavelengths, etc. As with the microprocessors of the laser transmitters, the amplifier microprocessors communicate with node control processors 140; through the node control processors, information from other parts of optical system 10 can be communicated to the amplifier module, as set forth below.

In the first east-west amplifier depicted in FIG. 2 the service channel is input onto the optical transmission path by service channel modem 160. Service channel modem 160 receives the information (e.g., telemetry information) to be placed on the service channel from node control processor 140. Service channel modem 160 includes a directly-modulated laser source at 1625 nm for creating a modulated optical signal. Suitable optical sources for use in the service channel modem are commercially available from EG&G. The outgoing service channel is output onto optical path 163 which terminated at interconnection element 80 such that the multilayer interference filter 82 reflects the channel towards the second stage 54 of optical amplifier 50, thereby multiplexing the service channel optical signal with the payload wavelength division multiplexed optical signal.

The service channel optical signal injected into the first amplifier of FIG. 2 is separated from (demultiplexed) from the payload optical signal at the second east-west amplifier by interconnection element 80 and placed onto service channel optical path 161. The service channel optical signal is converted to electrical signals by service channel modem 162 communicating with the second optical amplifier. These electrical signals are communicated to node control processor 142. Node control processor determines the destination and use of the information contained on the service channel. Information destined for the amplifier module is communicated through the amplifier microprocessor. Information intended for downstream destinations is electrically communicated to service channel modem 164 where it is imparted to the modulator for the outgoing optical service channel placed on optical path 165. Optical path 165 terminates at interconnection element 80 such that the filter reflects the input service channel towards the second stage of the optical amplifier.

If the node control processor determines that the service channel information is intended for an upstream destination, the information is placed on the outgoing service channel of service channel modem 162. This outgoing service channel is placed onto optical path 166 which terminates in interconnection element 80 of the centrally-depicted amplifier of the west-east transmission path of FIG. 2. The information transmitted on the west-east propagating service channel is received by an upstream node control processor (e.g., node control processor 140) and properly routed to the intended destination.

Following transmission and amplification of the multiplexed optical signals along waveguide 40, each channel must be demultiplexed and routed to the receiver designated for the particular channel. The multiplexed signal is input to optical splitter 90 which places a portion of the multiplexed signal onto plural output paths 92. Each output path 92 optically communicates with a demultiplexer wavelength selector system 100. Optical splitter 90 is selected from any optical device which can divide an input optical signal and place it onto plural output paths. Exemplary splitters include passive optical components such as those components described for use as optical combiner 30. Optical splitter 90 includes an input port 92 and plural output ports 94. As used herein, the term "demultiplexer wavelength selector" denotes a terminal wavelength selector which sends a payload optical channel to a terminal optical receiver.

Optical splitter 90 places a portion of the multiplexed optical signal through each of the splitter output ports 94. The output portion of the WDM optical signal from splitter 90 enters the demultiplexer wavelength selector through optical path 111 and passes into coupler 112. Coupler 112 is typically a 3 dB fused fiber coupler. The optical signal entering coupler 112 through port A is equally divided between output ports C and D. The portion of the optical signal exiting the coupler through port D passes through low reflectivity port 116 and exits the optical system. The low reflectivity port 116 is typically an angled fiber cut, although any low reflectivity waveguide termination technique may be employed.

The portion of the optical signal which exits coupler 112 through port C encounters optical filter 110. The optical filter passes optical signals having wavelengths other than the channel wavelength to be sent to the terminal receiver. These non-selected channels pass through low reflectivity port 115 and exit the optical communication system. The channel wavelength is reflected by optical filter 110 to be routed towards the terminal optical receiver (not shown) through coupler 112, exiting onto optical path 117 through coupler port B. As used herein, the expression "terminal optical receiver" denotes a receiver which accepts a payload optical channel from a demultiplexer wavelength selector. Exemplary terminal optical receivers carry data rates of at least about 50 Mbit/sec.

In an exemplary embodiment, the optical filter comprises a Bragg grating which reflects the selected channel wavelength and transmits all other wavelengths. The Bragg grating typically comprises a series of photoinduced refractive index perturbations in an optical fiber which causes the reflection of optical signals within a selected wavelength band. Bragg gratings suitable for use in the optical system of the present invention are described in Morey et al., "Photoinduced Bragg Gratings in Optical Fibers," *Optics and Photonics News*, February 1994, pp. 8–14, the disclosure of which is incorporated by reference herein. Although the above-described in-fiber Bragg gratings are exemplary optical filters, it is understood that other types of Bragg gratings can be employed as optical filter 110, including, but not limited to, bulk gratings, e.g., photoinduced refractive index perturbations in bulk optical media. Thus, as used herein, the term "Bragg gratings" encompasses in-fiber, waveguide, and bulk versions of these optical components.

The reflection wavelength of an in-fiber Bragg grating is temperature sensitive; typically, the grating wavelength shifts approximately 0.1 nm for about each 9 degrees of temperature change, the amount of wavelength shift depending in part upon the material properties of the fiber in which the Bragg grating is written. Consequently, Bragg gratings must be maintained in a controlled thermal environment. However, this property of Bragg gratings also makes it possible to shift the reflection wavelength through thermal control.

To provide a closed loop WDM optical system, the grating wavelength of maximum reflectivity is correlated to one of the incident optical channels. In an exemplary embodiment, thermal control is used to lock the grating wavelength to the wavelength of the corresponding optical channel. A portion of the optical signal reflected by grating 110 is tapped through optical tap 121 and routed to optical detector 122. Optical detector typically comprises a photodiode for converting optical signals to electrical signals. The converted electrical signals are transported along electrical path 123 to microprocessor 129. The microprocessor examines the strength of the optical signal, compared to previous optical signals. A digital step-track algorithm used by microprocessor 129, as described above in conjunction with the operation of the wavelength reference of laser transmitter 20, optimizes the parameters of heater 128 through controller 126 to maintain the temperature of the grating for maximum signal reflection. Note that while element 128 is depicted as a heater, typically a resistive heater, any device capable of maintaining the grating temperature, including, but not limited to, heaters and thermoelectric coolers, can be used as element 128 in wavelength selector 100.

As with the microprocessor of the laser transmitter, microprocessor 129 can be programmed to disregard abnormally large changes between adjacent data points, assuring that the grating will not attempt compensation in response to spurious signals. Further, microprocessor 129 receives information from node control processor 144, including information concerning the status of the laser transmitter corresponding to the wavelength selector of microprocessor 129. Without ascertaining whether the corresponding laser transmitter is operating, the microprocessor might drive the selector grating into a reflection wavelength occupied by an adjacent optical channel in an attempt to maximize the reflected optical signal. Further, the microprocessor can be programmed to limit the attempted wavelength excursions to avoid adjacent channels. In this manner, the signal wavelength reflected by the grating is correctly locked to the incident channel wavelength. Optionally, identifying tones on each optical channel can be used to ensure that a wavelength selector is correctly correlated to its corresponding optical channel.

Because the laser wavelength is itself correlated to a wavelength reference, as described above, the optical system is a closed-loop system, suitable for ultra-dense WDM applications. Advantageously, the locking of the grating to the incident channel wavelength permits the use of extremely narrow gratings at the peak reflectance, the region of interest for grating use, as described above. For example, the grating width at peak reflectance can be on order of a few times the signal width, instead of the current width of much greater than an order of magnitude larger than the incident signal bandwidth. Accordingly, the base width of the grating (i.e., the width of the grating at low reflectance) is greatly narrowed, permitting a greater channel density within a given spectral region.

While in many applications the present invention is used to correlate the grating wavelength to the incident channel wavelength, it is understood that the microprocessor can drive the grating wavelength to other desired locations in response to the incident channel. For example, if it is desired to position the grating such that it reflects no incident optical channel (for channel routing applications, see U.S. patent application Ser. No. 08/512,294, the disclosure of which is incorporated herein by reference), the microprocessor can be programmed to minimize the optical signal reflected by the Bragg grating.

Figure 4:
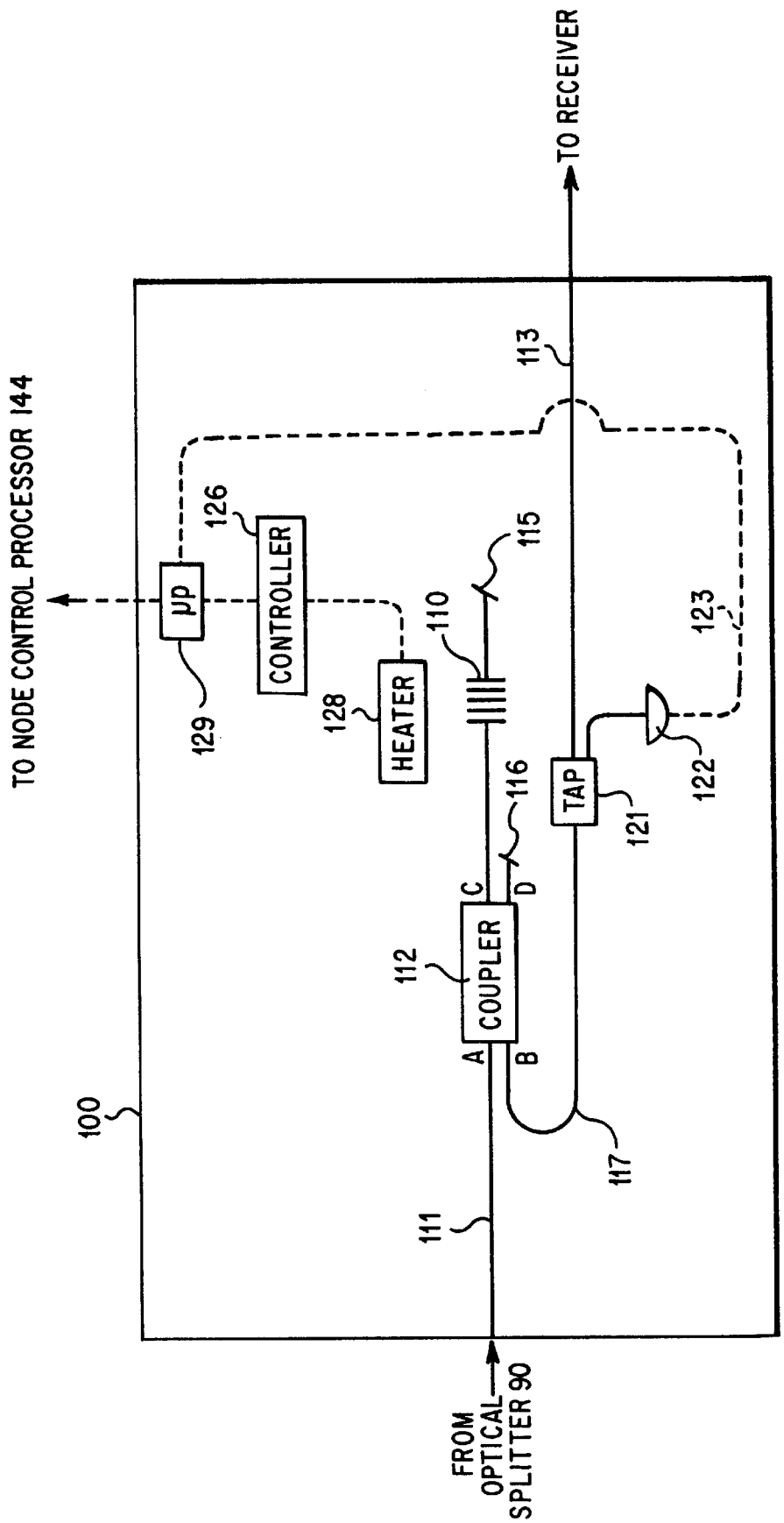
FIG. 4 schematically depicts a wavelength selector for use with the wavelength division multiplexed optical communication system of FIG. 1.

Although thermal tuning of a Bragg grating to an incident optical channel is depicted in FIG. 4, any other technique which shifts the reflection wavelength of a Bragg grating may be employed in the optical systems of the present invention. For example, the reflection wavelength of a Bragg grating may be shifted through strain-tuning, in which the amount of physical tension on a Bragg grating is varied, thereby altering the distance between adjacent refractive index perturbations and changing the grating wavelength. A typical strain tuning configuration is described in U.S. Pat. No. 5,042,898, the disclosure of which is incorporated by reference herein. In this patent, strain tuning is generally used to compensate for thermal changes, although the configuration described therein is also suitable for shifting the grating wavelength in a controlled thermal environment. Grating strain tuning is easily incorporated into the feedback loop of FIG. 4 by having controller 126 send electrical signals to a motor which rotates the threaded fasteners of the '898 strain tuning device. The threaded fasteners respectively control the tension experienced by the grating, thereby calibrating the grating wavelength.

Although wavelength selector filter 110 is depicted as a single grating, it is understood that the principles of the present invention apply to optical filters employing plural Bragg gratings in a variety of configurations. Typically, devices employing plural Bragg gratings have an associated characteristic device wavelength. Exemplary optical filters employing plural Bragg gratings which can be calibrated to an incident wavelength are described in U.S. Pat. Nos. 5,457,760 and 5,475,780, the disclosures of which are incorporated by reference herein. In both patents, plural gratings are used to create optical filters having a characteristic passband corresponding to an incident channel wavelength.

Further, it is understood that any Bragg grating positioned at any location in an optical system can be calibrated to an incident optical signal according to the present invention. Other devices incorporating Bragg gratings which can be calibrated to an incident optical signal according to the present invention include, but are not limited to Michelson interferometers, Mach-Zehnder interferometers, Sagnac loops, add/drop multiplexers, and ASE filters. See, for example, Bilodeau et al., *IEEE Phot. Tech. Lett.*, Vol. 6, No. 1, January, 1994, pp. 80–82, the disclosure of which is incorporated by reference herein. Because these optical devices incorporating Bragg gratings all determine, in some manner, which optical signals will be transmitted and which will be reflected, the term "wavelength selector," as used herein, broadly denotes any optical device incorporating one or more Bragg gratings which regulate optical transmission.

Following selection by wavelength selectors 100, the channel wavelength is input to an optical receiver (not shown) through waveguide 113. Optionally, the signal may be optically amplified before it reaches the receiver. The optical receiver generally detects the optical signal and converts it to an electrical signal, typically through the use of a photodiode device. Various optical receivers suitable for use in optical system 10 are described in Gowar, *Optical Communication Systems*, discussed above. In optical communication system 10, the receiver will frequently be part of an existing optical communication system to which the reception channel wavelength is routed. Consequently, the optical system 10 can function with numerous types of receivers to ensure compatibility with existing optical equipment.

While FIGS. 2 and 4 schematically depict the wavelength selectors as positioned adjacent optical receivers, the wavelength selectors of the present invention can be positioned at any location within optical communication system 10 where an individual optical channel is to be selected. Such locations include optical channel add locations, optical channel drop locations, optical routers, etc. The technique for correlating a grating reflection wavelength to an incident optical signal according to the present invention is useful at any location in an optical system where wavelength selection is employed.

Figure 5:
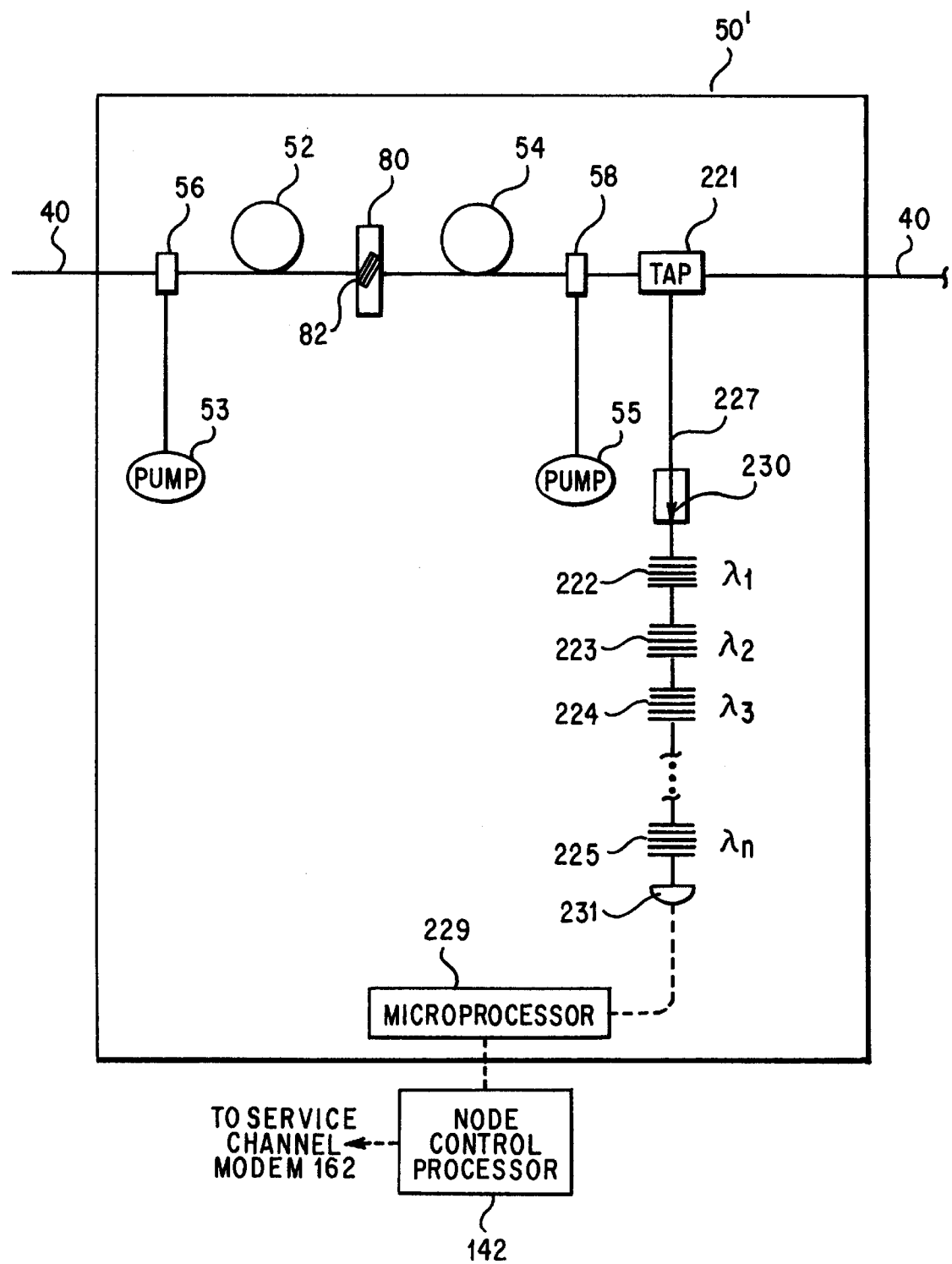
FIG. 5 schematically depicts a set of remote wavelength reference gratings for use with the wavelength division multiplexed optical communication system of FIG. 1.

As discussed above, a set of wavelength references may be positioned at a selected location in the optical communication system, remote from both the optical transmitters and the wavelength selectors. As used herein, the expression "remote" denotes any position in the optical system after the optical signals from the individual optical channels have been multiplexed. FIG. 5 depicts an exemplary embodiment in which remote wavelength references are positioned within an amplifier module beyond the second amplifier stage. In this embodiment, the optical carrier signals emitted by the laser transmitters are modulated with unique identifying tones to distinguish optical carriers of different wavelengths. When the optical signals are converted to electrical signals, the identifying tones permit the detector electronics to separate the transmitter signals. In amplifier 50', an optical tap 221 is positioned following second amplifier stage 54, the tapped optical signal travelling along optical path 227. Wavelength references 222–225 for calibration of each of the optical channels are positioned along optical path 227. As depicted in FIG. 5, the wavelength references are Bragg gratings, each of which is fabricated to reflect a particular optical channel. As with the Bragg grating 25 used in the optical transmitter 20 of FIG. 3, gratings 222–225 are precise, weak gratings with a maximum reflectivity at the reflection wavelength of 50%. Although not shown, the wavelength references are maintained in a controlled thermal environment. The transmitted optical signals are received by optical detector 231, converted to electrical signals, and communicated to amplifier microprocessor 229. As in the previous embodiments, the microprocessor communicates with the node control processor, which transmits the information via the optical service channel back to the microprocessors of the respective laser transmitters. The microprocessor then uses the wavelength reference information to calibrate the laser transmitter using the feedback path described in connection with FIG. 3. Although use of an optical service channel to transmit feedback information to the optical transmitters is exemplary, any route, optical, electrical, or a combination thereof, can be used to transmit the feedback information in the optical systems of the present invention.

While locking to the transmission minima of a weak grating is exemplary, it is understood that locking to other grating regions in weak or strong gratings is within the scope of the present invention. Further, the use of a digital step-track algorithm for the dynamic correlation of transmitter and grating wavelengths is exemplary. Other algorithms for determining the locking position or, alternatively, analog electronic circuits for dynamically correlating transmitter and grating wavelengths are encompassed by the techniques of the present invention.

Depending upon the location of the remote wavelength references, plural optical transmitters can use the references. Further, any wavelength selectors locked to incident optical channels (which are calibrated by the wavelength references) will also be locked to the wavelength references. In this manner, a single set of precision wavelength references, such as Bragg gratings, can be used to calibrate an entire WDM optical system, greatly reducing system fabrication costs. It is understood that the wavelength Bragg grating wavelength references depicted in FIG. 5 are adjacent an optical amplifier for the purpose of logistic convenience; the wavelength references do need require co-location with an optical amplifier.

In an exemplary embodiment, the remotely-located wavelength references form the demultiplexer wavelength selectors for the optical communication system. That is, the same set of gratings is used both for wavelength references and for the wavelength selectors which send the optical channels to the terminal receivers. Consequently, only half the number of gratings are needed as compared to a system which uses both local grating, wavelength references and demultiplexer wavelength selector gratings. In this embodiment, the optical communication system is substantially similar to the optical system of FIG. 2. The system employs wavelength selectors configured substantially similar to those depicted in FIG. 4 and optical transmitters configured substantially similar to those depicted in FIG. 3 with the exception that optical tap 21, grating reference 25 and optical detector 24 are eliminated (since their functions are replaced by components in the wavelength selector, as described below). In operation, optical signals are launched by the laser transmitters, multiplexed to form a WDM signal, amplified, and split into plural WDM signal portions as in the previously-described embodiment. The desired optical channel is selected by the Bragg grating of optical filter 110, with a portion of the selected optical channel diverted by optical tap 121 to optical detector 122 which converts the optical signal to an electrical signal which is communicated to microprocessor 129. However, in this embodiment, the microprocessor communicates the information to node control processor 144 for upstream feedback via the optical service channel to the respective laser transmitter. As in the embodiment described with respect to FIG. 4, a digital step-track algorithm resident in the microprocessor attempts to adjust the laser temperature to optimize the optical carrier wavelength. For this embodiment, the digital step-track algorithm moves the laser in the direction which maximizes the reflection by the wavelength selector grating.

In the wavelength selector, the temperature is held constant by microprocessor 129 through controller 126 and heater 128. Since, in this embodiment, the laser wavelength is locked to the selector grating wavelength, the selector grating wavelength is held constant through the controlled thermal environment. In this manner, a wavelength division multiplexed optical communication system is produced in which the laser transmitters are locked to the wavelength selectors, ensuring accurate conformance of the launched optical channel wavelength to the corresponding optical channel selection element.

While the foregoing invention has been described in terms of the embodiments discussed above, numerous variations are possible. Accordingly, modifications and changes such as those suggested above, but not limited thereto, are considered to be within the scope of following claims.

What is claimed is:

1. An optical device comprising:

a Bragg grating for coupling to an optical waveguide, said Bragg grating having an optical wavelength characteristic and interacting with light transmitted along said optical waveguide;

a detector coupled to said waveguide, said detector generating a sense signal in response to said interacted light;

a temperature regulating element coupled to said Bragg grating; and a control circuit coupled to said detector and said temperature regulating element, said control circuit supplying an adjustment signal to said temperature regulating element in response to said sense signal, thereby regulating a temperature of said Bragg grating.

2. An optical device in accordance with claim 1, wherein said control circuit comprises a microprocessor.

3. An optical device in accordance with claim 1, wherein said detector is coupled to said optical waveguide to sense light reflected from said Bragg grating.

4. An optical device in accordance with claim 1, wherein said detector is coupled to said optical waveguide to sense light transmitted through said Bragg grating.

* * * * *